(12) United States Patent
Boehling et al.

(10) Patent No.: US 8,915,778 B2
(45) Date of Patent: Dec. 23, 2014

(54) HYBRID SOLAR ATTIC VENT

(75) Inventors: Steven V. Boehling, Wilmington, NC (US); Brent A. Coats, Wilmington, NC (US)

(73) Assignee: Building Materials Investment Corporation, Wilmington, DE (US)

( * ) Notice: Subject to any disclaimer, the term of this patent is extended or adjusted under 35 U.S.C. 154(b) by 1095 days.

(21) Appl. No.: 12/474,641

(22) Filed: May 29, 2009

(65) Prior Publication Data

US 2010/0304660 A1 Dec. 2, 2010

(51) Int. Cl.
| | | |
|---|---|---|
| F24F 7/00 | (2006.01) | |
| F24F 7/007 | (2006.01) | |
| F24J 2/52 | (2006.01) | |
| F24F 7/02 | (2006.01) | |
| H01L 31/042 | (2014.01) | |
| F24F 5/00 | (2006.01) | |

(52) U.S. Cl.
CPC ..... *H01L 31/0422* (2013.01); *F24F 2005/0067* (2013.01); *F24J 2/5264* (2013.01); *Y02E 10/50* (2013.01); *F24J 2/5233* (2013.01); *Y02E 10/47* (2013.01); *Y02B 10/20* (2013.01); *Y02B 10/12* (2013.01); *F24F 7/025* (2013.01)
USPC ............................ 454/343; 136/244; 236/49.3

(58) Field of Classification Search
CPC ....... F24F 7/007; F24F 7/025; F24F 11/0001; F24F 11/0012; F24F 11/053; H01L 31/05
USPC ............................ 454/343; 136/244; 236/49.3
See application file for complete search history.

(56) References Cited

U.S. PATENT DOCUMENTS

| | | | | |
|---|---|---|---|---|
| 2,288,636 | A | * | 7/1942 | Malone .................... 200/38 DA |
| 4,251,026 | A | * | 2/1981 | Siegel et al. ................. 236/49.3 |
| 4,432,273 | A | * | 2/1984 | Devitt ............................ 454/343 |
| 5,078,047 | A | * | 1/1992 | Wimberly ..................... 454/368 |

(Continued)

FOREIGN PATENT DOCUMENTS

| | | | | |
|---|---|---|---|---|
| JP | 63282435 | A | * 11/1988 | ............... F24F 7/10 |
| JP | 06306997 | A | * 11/1994 | ............... E04B 7/18 |
| JP | 11-68834 | A | * 6/1999 | |
| JP | 11168834 | A | * 6/1999 | |

OTHER PUBLICATIONS

Seguchi, JP 11-68834 English machine translation, Jun. 22, 1999.*
Seguchi, JP 11168834 A English machine translation, Jun. 1999.*

(Continued)

*Primary Examiner* — Kang Hu
*Assistant Examiner* — Phillip E Decker
(74) *Attorney, Agent, or Firm* — Womble Carlyle Sandridge & Rice, LLP

(57) ABSTRACT

A hybrid solar attic vent comprising a housing configured to be mounted on the roof or in the gable of a building in communication with the attic of the building. A photovoltaic solar panel is positioned to be exposed to sunlight and to power the attic fan when sufficient sunlight is present. An alternative source of energy, which may be the building's AC power, is connected to the fan through an electronic control module. The control module monitors the output of the solar panel and switches the fan's power source from solar power to the alternative source of energy when the solar panel produces insufficient electrical energy to power the fan. A thermostat allows operation of the fan by the alternative power source only when the temperature in the attic is above a predetermined threshold.

9 Claims, 3 Drawing Sheets

(56) References Cited

U.S. PATENT DOCUMENTS

| | | | |
|---|---|---|---|
| 5,131,888 A * | 7/1992 | Adkins, II | 454/343 |
| 6,306,030 B1 * | 10/2001 | Wilson | 454/16 |
| 6,338,677 B1 * | 1/2002 | White | 454/335 |
| 6,695,692 B1 * | 2/2004 | York | 454/199 |
| 6,792,938 B2 * | 9/2004 | Komano et al. | 126/597 |
| 7,024,876 B1 * | 4/2006 | Kishek | 62/236 |
| 7,507,151 B1 * | 3/2009 | Parker et al. | 454/368 |
| 7,850,513 B1 * | 12/2010 | Parker et al. | 454/228 |
| 8,123,142 B2 * | 2/2012 | Cislo | 236/49.3 |
| 8,354,818 B2 * | 1/2013 | Louch et al. | 320/101 |
| 8,368,240 B1 * | 2/2013 | Burkett | 290/44 |
| 2002/0117166 A1 * | 8/2002 | Okumura | 126/633 |
| 2006/0149422 A1 * | 7/2006 | Dunstan et al. | 700/276 |
| 2007/0243820 A1 * | 10/2007 | O'Hagin | 454/365 |
| 2008/0041083 A1 * | 2/2008 | Al-Garni et al. | 62/235.1 |
| 2008/0152482 A1 * | 6/2008 | Patel | 415/121.3 |
| 2009/0203308 A1 * | 8/2009 | O'Hagin et al. | 454/341 |
| 2010/0330898 A1 * | 12/2010 | Daniels | 454/365 |

OTHER PUBLICATIONS

Seguchi, JP 11-168834A English machine translation, Jun. 1999.*

* cited by examiner

HYBRID SOLAR ATTIC VENT

TECHNICAL FIELD

This disclosure relates generally to attic ventilation and more particularly to attic vents that include powered fans for drawing hot and/or stagnant air out of an attic and exhausting it to the environment.

BACKGROUND

It has long been known that ventilating the attic space below a roof is highly desirable for a variety of reasons. These reasons include, for instance, lowering the temperature in the attic during summer months, lowering humidity levels in the attic during winter months, reducing heating and cooling costs in the living space below the attic, and reducing instances of mold and mildew growth within the attic. Accordingly, a wide variety of attic ventilators or vents have been developed over the years. These include passive attic vents through which hot air is exhausted by convection and active attic vents that forcefully draw air out of an attic space. Passive vents may include, for instance, dome vents and louver vents that are installed within a hole cut in the attic deck, or ridge vents that are installed over a slot cut along the ridge of a gable roof. Active vents also come in various forms, such as powered gable vents, wind turbine roof deck vents, and powered roof deck vents. Regardless of the type of vent selected, a corresponding area of inlet vents must be provided to allow fresh air to flow into the attic to replace the air expelled through the attic vent. These generally take the form of soffit vents that are installed over openings formed along the soffits of the roof. For roofs without soffits, fascia vents have been developed for the same purpose. In either event, fresh air is drawn into the attic in the regions of the soffits as stale air is exhausted to the environment.

More recently, to preserve electricity and help the environment, solar powered attic vents have been developed. These vents generally are provided with direct current (DC) electric fans that are driven with electricity generated by a photovoltaic solar panel, which may be mounted on the vent or in a location spaced from the vent. The Master Flow™ brand solar powered roof vent marketed by GAF Materials Corporation is one example of a solar powered roof vent. Some solar powered roof vents include batteries that are charged by the solar panel during sunlight so that some operational capacity is preserved for periods when the sun is not shining.

Solar powered attic vents are environmentally friendly, but nevertheless have certain inherent shortcomings. For instance, while they operate in a satisfactory manner in full sun, their efficiency diminishes significantly in cloudy conditions and even more significantly in overcast and rainy conditions. Furthermore, solar powered attic vents do not operate for long periods at night, even with stored battery backup. Attic vents powered by a home's AC supply grid are reliable in that they can operate in all conditions, but consume significant electrical power and thus are not as environmentally friendly as desired.

A need thus exists for a powered attic vent that exhibits the environmental responsibility of a solar attic vent while also being able to perform with the reliability of an AC powered attic vent when needed.

SUMMARY

Briefly described, a hybrid solar attic vent includes a vent housing that fits over a hole in a roof deck. The housing contains a fan that is driven by an electric motor, which may be a direct current (DC) electric motor. A photovoltaic solar panel generates voltage when bathed in sunlight and is electrically coupled to an electronics module (EM) to which the DC motor also is coupled. The EM is further connected to a home's AC power source and includes a power supply that converts the AC power to a DC power with a voltage appropriate for driving the DC motor of the attic vent. The EM monitors input voltage from the solar panel and can automatically switch from solar panel supplied electricity to home supplied electricity under certain predetermined conditions. For example, if the sunlight on the solar panel is momentarily obscured by clouds, then the EM may allow current from the power supply to power the fan. When the solar panel is once again bathed in sunlight, the EM changes or switches the voltage input to the fan from the power supply to the solar panel. The EM also may switch operation of the fan from solar power to home power after sunset when there is little sunlight but attic temperatures are still high. A thermostat may be included for operation in house power source mode to reduce power consumption when active ventilation is not required.

Thus, a hybrid solar attic vent is now provided that exhibits the advantages of exclusively solar powered vents in sunny conditions and that also can operate as needed when the sun is not shining, thereby also offering the advantages of a AC powered attic vent. Furthermore, when the attic vent of this disclosure operates on household current, it has been found to consume less that twenty five percent of the energy of a standard AC voltage attic fan. This is believed to be the result of a very efficient DC motor, power supply, and EM circuit that render the vent "green" even when operating on household current. These and other distinctions, aspects, and advantages of the hybrid solar attic vent of this disclosure will become more apparent upon review of the detailed description set forth below when taken in conjunction with the accompanying drawing figures, which are briefly described as follows.

DETAILED DESCRIPTION

Figure 1:
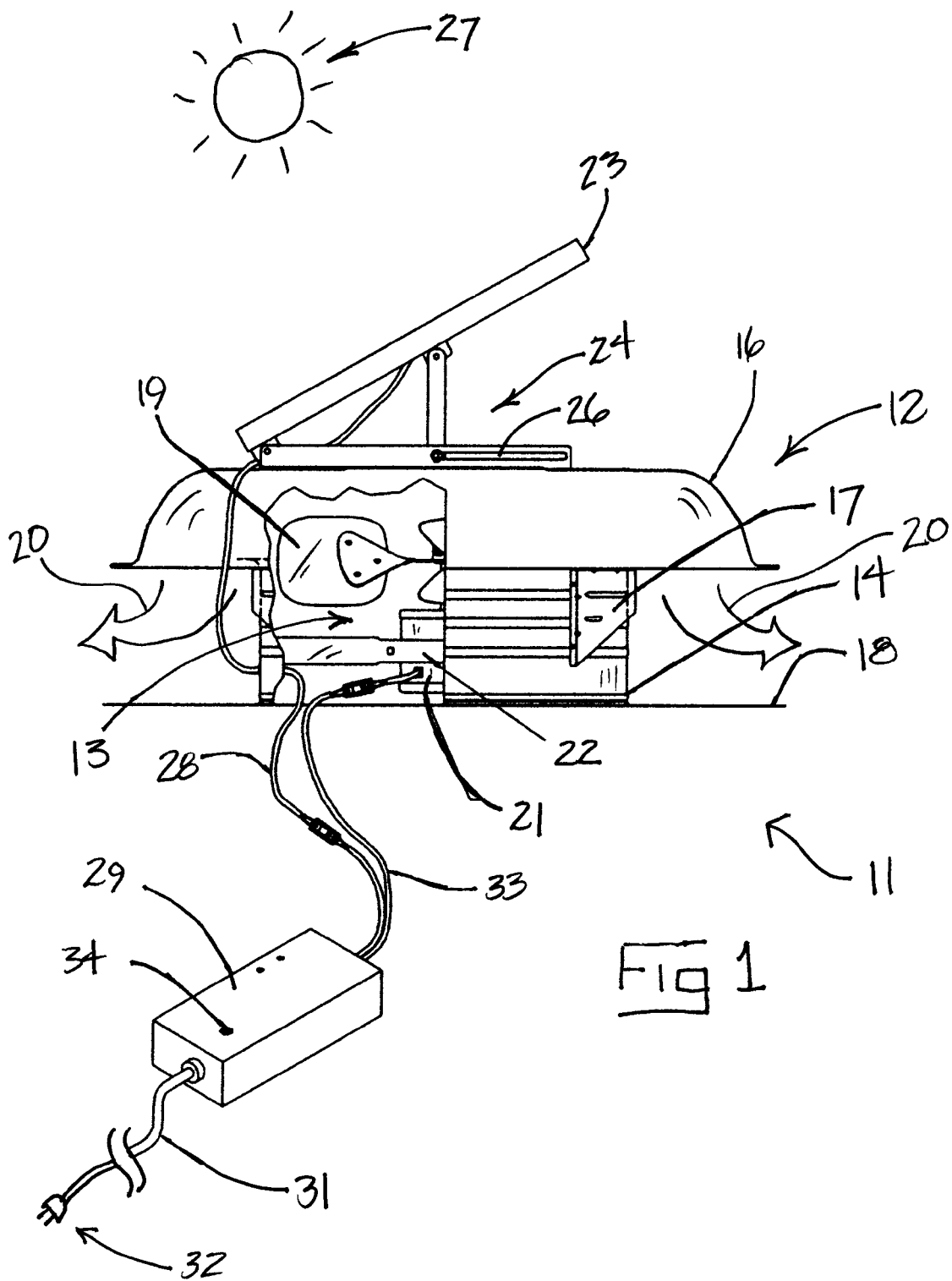
FIG. 1 is a side elevational and partially cut away view of a hybrid solar roof mounted attic fan that embodies principles of the disclosure.

Referring now in more detail to the drawing figures, FIG. 1 illustrates a roof mounted hybrid solar attic fan 11 that embodies principles of the disclosure. The fan assembly 11 has a fan housing 12 that houses a direct current (DC) powered fan 13. The housing 12 is formed from a cylindrical stack 14 over which is mounted a rain hood 16 by means of a hood support 17. The DC fan 13 includes a DC fan motor 21 mounted within the stack 14 by means of a motor support 22. Fan blades 19 are mounted to the shaft of the DC motor 21. Flashing 18 projects outwardly around the bottom rim of the stack 14 for mounting the fan assembly 11 to a roof covering an opening and integrating the fan assembly 11 sealingly with the shingles of the roof. When the DC motor 21 is activated by application of a DC voltage, it spins the fan blades 19, which, in turn, draws air from the attic below and exhausts it to the atmosphere, as indicated by arrows 20.

A photovoltaic solar panel 23 is, in this embodiment, mounted to the top of the rain hood 16 by means of a mounting bracket 24. The mounting bracket 24 includes an adjustment slot 26 that allows adjustment of the angle of the solar panel 23 so that it may be oriented for maximum exposure to direct sunlight from the sun 27. It will be understood that the solar panel need not be mounted directly to the rain hood, but may instead be mounted in a remote location if necessary to place it in the best position for absorbing sunlight. When exposed to sunlight, the solar panel 23 generates a DC electrical voltage through photovoltaic conversion. The voltage generated is dependent on the configuration of the photovoltaic cells of the solar panel 23, but may, for example, nominally be about 18 volts in bright sunlight with a gradual reduction in voltage as sunlight fades to darkness, at which time the solar panel does not produce appreciable voltage.

The DC voltage output of the solar panel 23 is coupled through connection 28 to an electronics module 29. The electronics module, which is described in more detail below, is also coupled through power cable 31 to a source of household alternating current (AC) power, which is schematically illustrated by an electrical plug 32. Of course, the power cable 31 may be wired directly to the household power grid without an electrical plug such that the plug 32 is merely illustrative of any appropriate connection to household AC power. The electronics module 29 also is electrically coupled through connection 33 to the DC fan motor 21. A thermostat adjustment 34 is provided on the electronics module 29 adjustment of a temperature threshold as described below.

Operation of the electronics module 29 according to principles of the disclosure will be described in detail below. Generally, however, the electronics module provides power to the DC fan motor 21 from the solar panel 23 when available and sufficient to power the motor, or, if solar power is not available, from the household power source. The electronics module 29 is designed to monitor the electrical output of the solar panel 23 and to switch automatically from solar panel-supplied power to household electricity when sufficient voltage is not being generated by the solar panel 23. This condition occurs at night, of course, but also may occur on cloudy days or when the sun is obscured by a passing cloud. If this occurs, power to the fan is switched temporarily from solar power to household electrical power, and is switched back to solar power when the solar panel 23 is once again bathed in sunlight. Thus, the fan continues to exhaust hot air from the attic even in the absence of sunlight.

In AC operation mode, a thermostat is provided that allows household power to flow to the fan motor only when the attic temperature is above a preset threshold. In this way, household electrical power is not consumed if the attic is not sufficiently hot to require ventilation. The preset threshold may be adjusted by means of the thermostat adjustment 34. Accordingly, for example, the attic fan 11 may operate on household power after sunset when the solar panel is not active but the attic is still hot. When the attic cools to a temperature below the preset threshold, the thermostat disconnects from the household power to minimize the use of commercial electricity and thus minimize the cost of operation of the attic fan 11.

Figure 2:
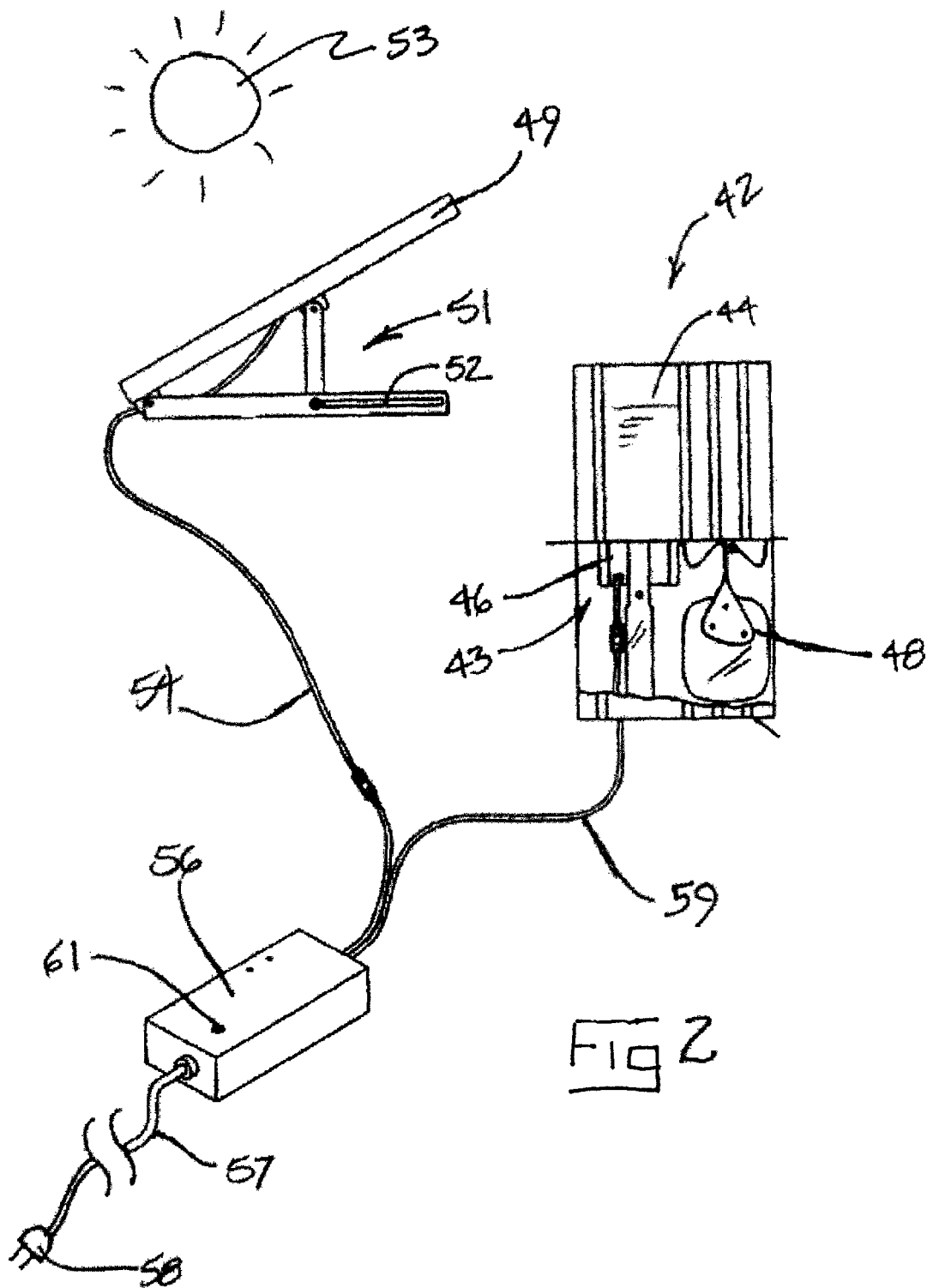
FIG. 2 is a side elevational and partially cut away view of a hybrid solar gable mounted attic fan that embodies principles of the disclosure.

FIG. 2 illustrates an alternate embodiment of a hybrid solar attic fan that embodies principles of the disclosure in a gable mounted attic fan. Many of the components of this embodiment are similar to those of the embodiment of FIG. 1. The gable mounted attic fan 42 includes a generally cylindrical fan housing or cowl 44 that surrounds a fan assembly 43. The fan assembly 43 includes a DC fan motor 46 that, when supplied with power, spins fan blades 48 to evacuate air from an attic and exhaust it to the atmosphere. The fan housing 44 mounts in the attic covering a hole in the gable of a home rather than mounting in the roof as in the embodiment of FIG. 1.

A solar panel 49 is mounted to the roof or other appropriate remote location where it can receive sunlight from the sun 53 to generate a DC voltage such as, for example, 18 volts. The solar panel 49 is secured by a mounting bracket 51, which includes an adjustment slot 52 allowing the angle of the solar panel 49 to be adjusted for maximum exposure to sunlight.

The solar panel is electrically connected to an electronics module 56, which is the same as the module 29 of FIG. 1. As in FIG. 1, the electronics module 56 is connected to the household electric grid, such as through a cable 57 and electric plug 58. The electronics module 56 also is electrically connected through connector 59 to the DC fan motor 46 for delivering operating power to the fan 43. The electronics module 56 functions just like the module 29 of FIG. 1 to supply operating power to the attic fan 42 from the solar panel 49 when it is exposed to sunlight and is generating sufficient power to operate the fan. When the power generated by the solar panel falls below a predetermined threshold, the electronics module automatically shifts the power source from the solar panel 49 to household electrical power to continue to operate the fan. A thermostat in the electronics module insures that AC power is not consumed if the attic temperature is below a preset threshold.

Figure 3:
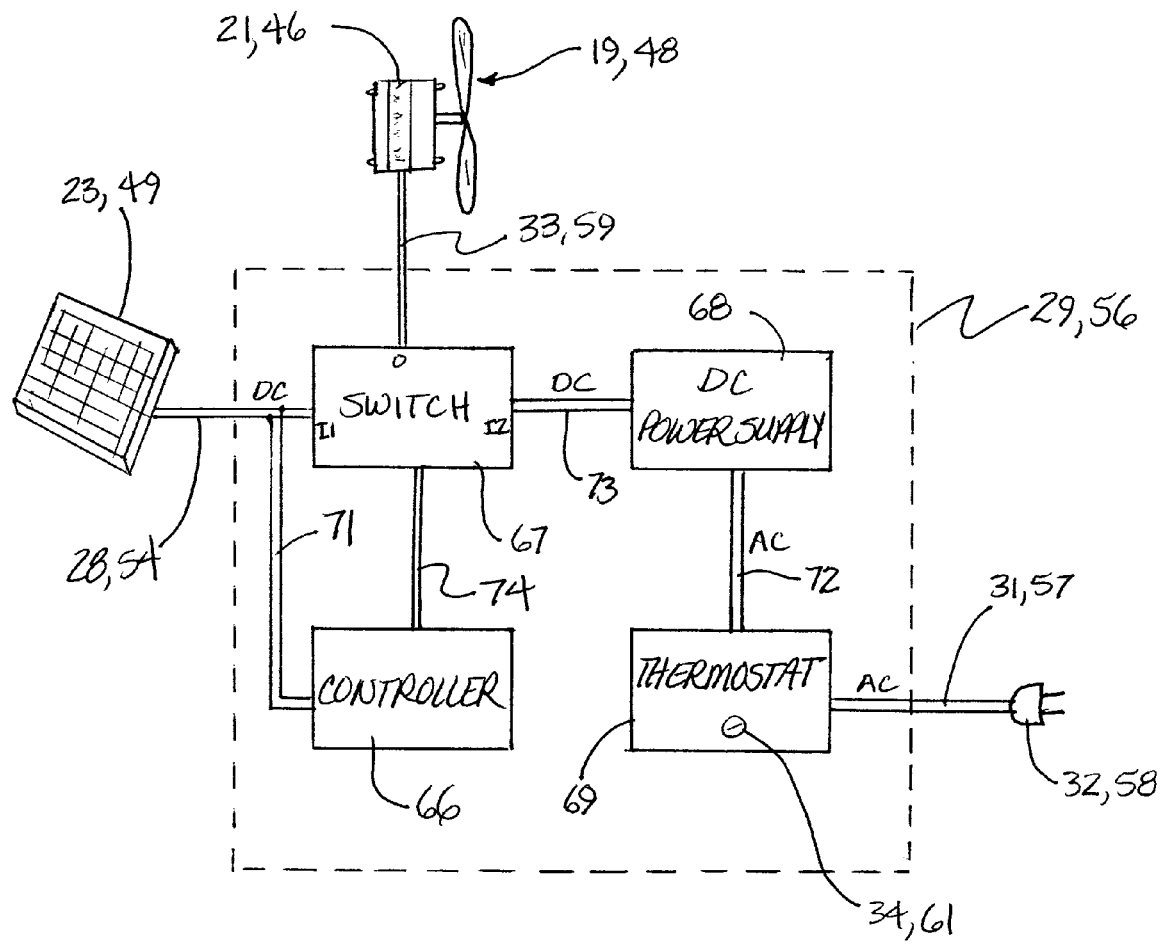
FIG. 3 is a modular schematic diagram of an electronics module for controlling a hybrid attic fan according to the disclosure.

FIG. 3 is a functional schematic showing one possible embodiment of an electronics module for controlling the source of power for operating the fan. It will be understood that this is but one exemplary embodiment, and that many other configurations of components and substitutions of components might be made by those of skill in the art to obtain equivalent results. In the embodiment of FIG. 3, the electronics module 29, 56, indicated in phantom line, is connected through wires or connector 28, 54 to solar panel 23, 49 and to fan motor 21, 46 through wires or connector 33, 59. The electronics module is also connected through cable 31, 57, as described above, to the household AC electrical power grid as illustrated by plug 32, and 58.

The electronics module 29, 56 houses numerous electronic components including a controller 66, a switch 67, a DC power supply 68, and a thermostat 69. The controller 66 may be a microprocessor or microcontroller programmed to carry out the monitoring and switching functions described below. The controller 66 is electrically coupled to connection 28, 54 from the solar panel 23, 49 for monitoring the voltage output of the solar panel. The switch 67 may be a double pole double throw relay-type switch that can switch either of two inputs to a common output upon application of a control signal. The controller 66 is electrically connected to the switch 67 by connection 74 through which the controller can selectively supply a control signal to the switch. One of the inputs of the switch is connected to the solar panel 23, 49 and the other is connected to the DC output of the DC power supply 68. The common output of the switch 67 is electrically connected to the fan motor 21, 46 through connection 33, 59.

The DC power supply may be a transformer coupled with associated diodes, capacitors, and/or a voltage regulator to transform standard AC voltage to DC voltage such as, for example, 24 volts DC. The input of the DC power supply is connected through the thermostat 69 and connection 31, 57 to the household AC electrical supply, indicated by plug 32, 58 in FIG. 3. The thermostat 69 is a temperature controlled switch that is configured to switch to an "off" condition when the temperature of its environment falls below a threshold, which can be adjusted by means of thermostat adjustment 34, 61.

In operation, the electronic control module preferably is located within the attic space of a building on which the hybrid solar attic vent of this disclosure is mounted and the solar panel 23, 49 is located to receive sunlight when the sun is out. In sunny conditions where the solar panel 23, 49 is bathed in ample sunlight, the panel produces a DC voltage, which may, for example, be 18 volts DC. The controller 66 is coupled to the output of the solar panel through connection 71 and is programmed to monitor the voltage output of the panel. As long as the controller detects that the solar panel produces a voltage sufficient to power the fan motor 21, 46, it conveys the appropriate control signal to switch 67 to cause the switch to connect input 11 to the output O. Thus, voltage produced by the solar panel 23, 49 is supplied through the switch 67 to the fan motor, which spins the fan blades 19, 48 to draw hot air out of the attic. In other words, when the solar panel is bathed in sunlight, the fan operates on solar power.

On cloudy days, at night, and briefly during a passing cloud, the solar panel 23, 49 may receive insufficient sunlight to power the fan. If the controller 66 detects through connection 71 that the solar panel 23, 49 is not producing a sufficient voltage to power the fan motor 21, 46, then the controller conveys a control signal along connection 74 that causes the switch 67 to connect input 12 to output O. This causes the DC voltage output of the DC power supply 68 to be connected to the fan motor 21, 46 through the switch 67. If the temperature in the attic where the electronic control module is located is above the threshold set with adjustment 34, 61, then the thermostat is in its "on" condition and AC power is supplied through connection 72 to the input of the DC power supply and, in turn, DC power is supplied to the fan motor 21, 46. In other words, when the solar panel is unable to power the fan because of darkness or cloud cover, and the attic temperature is still sufficiently high, the fan is powered by household current converted to DC by the DC power supply.

It will thus be seen that in sufficiently sunny conditions, the attic fan of this disclosure is powered by electricity produced by the solar panel 23, 49, which is clean and free. When it is not sufficiently sunny out, such as when a cloud passes or on rainy days, the attic fan is powered by electricity provided by the household electrical service. Further, after dusk when the temperature in the attic is still high but there is little sunlight, the fan operates on household power to draw hot air out of the attic until the temperature falls below the present threshold. While the household power source is not particularly clean, nor is it free, it has been found that, in household power mode, the fan consumes less than 25% of the power of a standard AC voltage attic fan as a result of the very efficient DC motor and electronic control module. Accordingly, the attic fan may be said to be "green" even when not operating on solar power.

The invention has been described herein in terms of preferred embodiments and methodologies considered to represent the best mode of carrying out the invention. Many modifications to the illustrated embodiments might be made by skilled artisans within the bounds of the invention. For example, while the fan has been illustrated as a fan that draws air out of the attic, it may be a fan that forces air into the attic such as, for instance, a soffit fan. Further, while household AC power source has been illustrated, any alternative power source other than the solar panel itself might be substituted with equivalent results. It will thus be clear to those of skill in the art that a wide variety of additions, deletions, and modifications might be made to the embodiments exemplified herein without departing from the spirit and scope of the invention as set forth in the claims.

What is claimed is:

1. A hybrid solar attic vent comprising:
    a housing configured to be mounted to a building in communication with an attic space of the building;
    a fan disposed in the housing and arranged, when powered, to move air out of the attic space;
    a switch selectable between a first input and a second input and having an output connected to the fan;
    a photovoltaic solar panel located for exposure to sunlight to produce a DC electrical voltage, the solar panel being connected to the first input of the switch to form a first DC power circuit with the fan;
    an alternate DC voltage source connected to the second input of the switch to form a second DC power circuit with the fan;
    a controller separate from the first DC power circuit and the second DC power circuit and configured to monitor the DC electrical voltage from the solar panel, the controller also being coupled to the switch and configured to connect the first input with the output to cause the switch to supply power to the fan from the solar panel when the solar panel is exposed to sufficient sunlight to power the fan, and to connect the second input with the output to supply power to the fan from the alternate DC voltage source when the solar panel is exposed to insufficient sunlight to power the fan; and
    a thermostat configured to switch off the alternate DC voltage source when the temperature of the attic falls below a predetermined threshold, wherein the thermostat includes an adjustment for selectively adjusting the predetermined threshold.

2. A hybrid solar attic vent as claimed in claim 1 and wherein the housing is configured to be mounted on a roof of the building.

3. A hybrid solar attic vent as claimed in claim 1 and wherein the housing is configured to be mounted in a gable of the building.

4. A hybrid solar attic vent as claimed in claim 1 and wherein the photovoltaic solar panel is mounted on the housing.

5. A hybrid solar attic vent as claimed in claim 1 and wherein the photovoltaic solar panel is mounted remotely from the housing.

6. A hybrid solar attic vent as claimed in claim 1 and wherein the alternate DC voltage source comprises a DC power supply for converting an AC electrical supply of the building.

7. A hybrid solar attic vent as claimed in claim 6 and wherein the thermostat is between the DC power supply and the AC electrical supply of the building.

8. A hybrid solar attic fan adapted to be powered by solar energy or by an alternate source of energy, the attic fan comprising:
    a housing configured for mounting to a building in communication with an attic of the building;
    a fan disposed in the housing and configured, when powered, to cause air to move out of the attic;
    a solar panel providing a first DC voltage to power the fan through a first DC power circuit when the solar panel is sunlit;
    an alternate source of energy providing a second DC voltage to power the fan through a second DC power circuit when the solar panel is not sunlit;

a thermostat positioned to measure the temperature within the attic and having an adjustment for selectively adjusting a predetermined threshold; and a control unit configured to monitor the first DC voltage and to switch between the first DC power circuit and the second DC power circuit according to predetermined conditions, wherein the control unit is separate from the first DC power circuit and the second DC power circuit; and wherein the thermostat is configured to switch off the second DC power circuit when the temperature in the attic falls below the predetermined threshold.

9. A hybrid solar attic fan as claimed in claim 8 and wherein the predetermined conditions comprise the solar panel producing the first DC voltage at a DC voltage level that is insufficient to power the fan.

* * * * *